(12) United States Patent
Murakami et al.

(10) Patent No.: US 11,127,696 B2
(45) Date of Patent: Sep. 21, 2021

(54) SEMICONDUCTOR DEVICE

(71) Applicant: Mitsubishi Electric Corporation, Tokyo (JP)

(72) Inventors: Haruhiko Murakami, Tokyo (JP); Keisuke Eguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/929,338

(22) Filed: Jul. 15, 2020

(65) Prior Publication Data

US 2021/0134741 A1 May 6, 2021

(30) Foreign Application Priority Data

Oct. 30, 2019 (JP) .............................. JP2019-197629

(51) Int. Cl.
*H01L 23/64* (2006.01)
*H01L 23/00* (2006.01)
*H01L 23/495* (2006.01)

(52) U.S. Cl.
CPC ........ *H01L 23/645* (2013.01); *H01L 23/4952* (2013.01); *H01L 23/49562* (2013.01); *H01L 23/49575* (2013.01); *H01L 24/48* (2013.01); *H01L 2224/48139* (2013.01); *H01L 2224/48245* (2013.01); *H01L 2924/10253* (2013.01); *H01L 2924/10272* (2013.01); *H01L 2924/12031* (2013.01); *H01L 2924/12032* (2013.01); *H01L 2924/13055* (2013.01); *H01L 2924/30107* (2013.01)

(58) Field of Classification Search
CPC ... H01L 23/645; H01L 24/48; H01L 23/4952; H01L 23/49562; H01L 23/49575; H01L 2224/48139; H01L 2924/30107; H01L 2924/12031; H01L 2924/12032; H01L 2924/13055; H01L 2924/10253; H01L 2924/10272; H01L 2224/48245
See application file for complete search history.

(56) References Cited

U.S. PATENT DOCUMENTS

| 7,880,174 | B2 | 2/2011 | Shimizu et al. | |
|---|---|---|---|---|
| 10,333,387 | B2 * | 6/2019 | Basler | ..................... H01L 29/16 |
| 2008/0258252 | A1 * | 10/2008 | Shimizu | .................. H01L 25/18 257/476 |
| 2009/0168471 | A1 * | 7/2009 | Tsugawa | .......... H03K 17/08148 363/56.01 |
| 2018/0019180 | A1 * | 1/2018 | Murakami | ............ H01L 25/072 |
| 2021/0134741 | A1 * | 5/2021 | Murakami | ........ H01L 23/49575 |

FOREIGN PATENT DOCUMENTS

JP           4980126 B2    7/2012

* cited by examiner

*Primary Examiner* — Robert G Bachner
(74) *Attorney, Agent, or Firm* — Studebaker & Brackett PC

(57) ABSTRACT

An object of the present invention is to provide a semiconductor device suppressing a ringing. A semiconductor device in an embodiment 1 includes an IGBT, an SBD connected to the IGBT in series, a PND connected to the IGBT in series and parallelly connected to the SBD, and an output electrode connected between the IGBT and the SBD and between the IGBT and the PND. An anode electrode of the PND is connected to the output electrode by the wiring via an anode electrode of the SBD.

5 Claims, 10 Drawing Sheets

F I G. 5
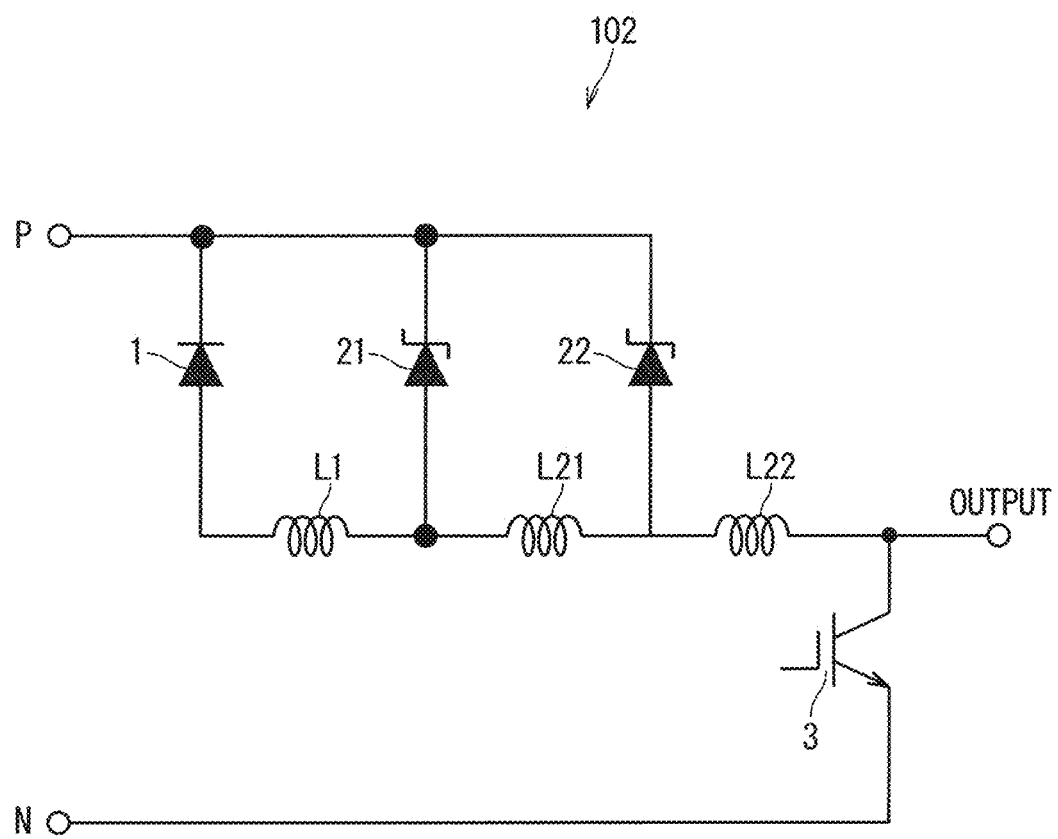

SEMICONDUCTOR DEVICE

BACKGROUND OF THE INVENTION

Field of the Invention

The present invention relates to a semiconductor device.

Description of the Background Art

A power module is conventionally provided with an Si insulated gate bipolar transistor (Si-IGBT) and an Si-PiN diode (a PiN diode is referred to as a PND hereinafter). Loss in the power module is determined by performance of a power device such as an IGBT or a diode. Recently proposed is a power module in which the Si-PND is replaced with an SiC Schottky barrier diode (SiC-SBD) to reduce the loss in the diode. When the SiC-SBD is used, switching loss in the diode can be reduced, and particularly under use conditions with high carrier frequency, a significant reduction in switching loss can be expected.

For example, a boost chopper circuit has an advantage that a reactor provided outside can be made small by increasing the carrier frequency. In the meanwhile, when the carrier frequency increases, the switching loss in the diode increases. Thus, the reduction in the switching loss can be expected by using the SiC-SBD. However, the SBD has an extremely small recovery current, thus di/dt increases, and a ringing occurs at a time of recovery.

As a countermeasure, Japanese Patent No. 4980126 proposes a method of reducing noise by parallelly connecting the PND to the SBD. Japanese Patent No. 4980126 describes that when an IGBT is turned on after current refluxes the SAD and the PND. forward current of the SBD and the PND stops and carrier accumulated in a diode flows in an opposite direction as recovery current, and the recovery current serves as a dumper suppressing the noise caused by resonance.

SUMMARY

However, a technique in Patent Document 1 has a problem that a ringing suppressing effect cannot be sufficiently obtained depending on wiring inductance between the SBD and the PND. The object of the present invention is to provide a semiconductor device suppressing a ringing.

A semiconductor device according to the present invention includes a switching element, at least one SBD, a PND, and an output electrode. The at least one SBD is connected to the switching element in series. The PND is connected to the switching element in series, and parallelly connected to the at least one SBD. The output electrode is connected between the switching element and the at least one SBD and between the switching element and the PND. An anode electrode of the PND is connected to the output electrode by a wiring via an anode electrode of the at least one SBD.

In the semiconductor device of the present invention, the anode electrode of the PND is connected to the output electrode by the wiring via the anode electrode of the at least one SBD, thus an inductance between the PND and the output electrode is larger than an inductance between the SBD and the output electrode. Accordingly, a fall time of a forward current of the PND is longer than a fall time of a forward current of the SBD, and a ringing is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram of a semiconductor device according to an embodiment 2.

DESCRIPTION OF THE PREFERRED EMBODIMENTS

A. Embodiment 1

Figure 1:
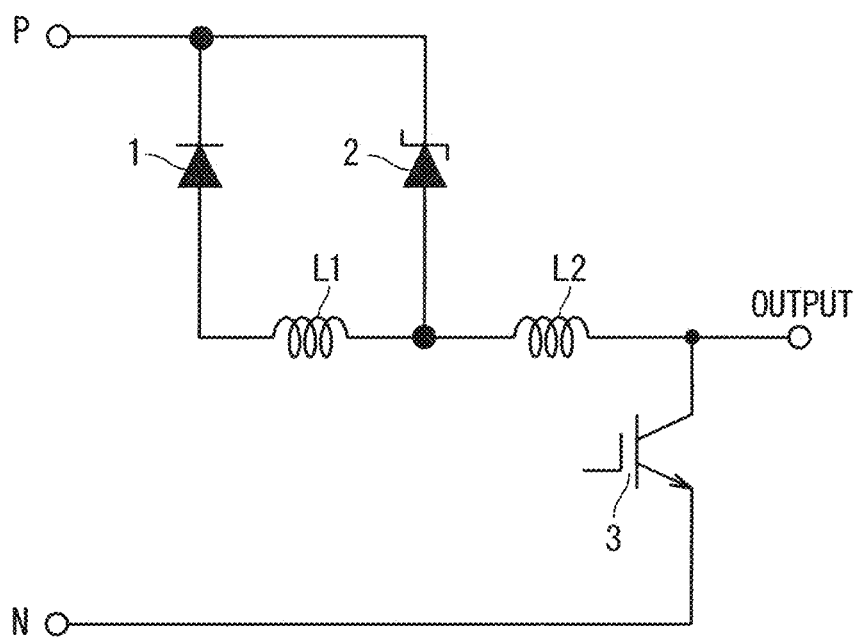
FIG. 1 is a circuit diagram of a semiconductor device according to an embodiment 1.
Figure 2:
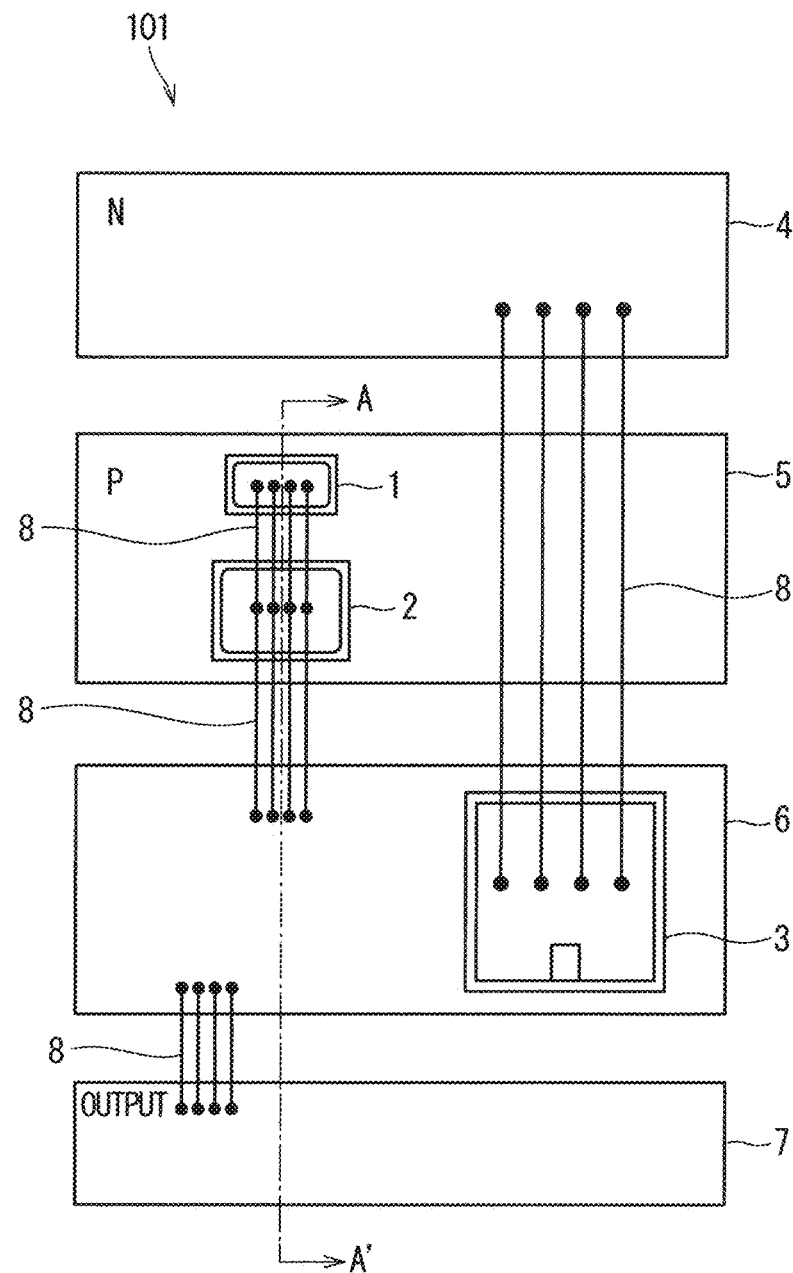
FIG. 2 is a top view of the semiconductor device according to the embodiment 1.
Figure 3:
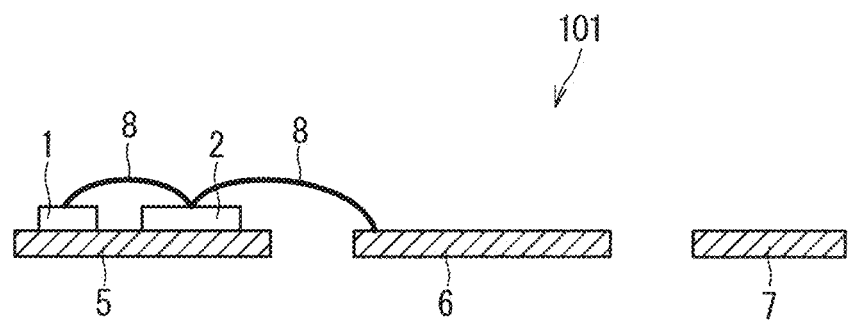
FIG. 3 is a cross-sectional view of the semiconductor device according to the embodiment 1.

FIG. 1 is a circuit diagram of a main portion of a semiconductor device 101 according to an embodiment 1. FIG. 2 is a top view of the main portion of the semiconductor device 101. FIG. 3 is a cross-sectional view along an A-A' line in FIG. 2.

The semiconductor device 101 includes an insulated gate bipolar transistor (IGBT) 3 which is a switching element, a Schottky barrier diode (SBD) 2, and a PiN-diode (referred to as PND hereinafter) 1. The SBD 2 and the PND 1 are connected to the IGBT 3 in series, and are parallelly connected to each other. An output electrode is provided between the IGBT 3 and the SBD 2 and between the IGBT 3 and the PND 1. The IGBT is described herein as an example of a switching element, however, a MOSFET may be used as a switching element in place of the IGBT.

An inductance L1 is provided between an anode of the SBD 2 and an anode of the PND 1, and an inductance L2 is provided between anode of the SBD 2 and an output electrode. That is to say, an inductance between an anode of the PND 1 and an output electrode is L1+L2, which is larger than the inductance L2 between the anode of the SBD 2 and the output electrode.

As illustrated in FIG. 2, the semiconductor device 101 includes lead frames 4, 5, 6, and 7. The lead frames 4, 5, and 7 correspond to an N terminal, P terminal, and output electrode of the semiconductor device 101, respectively. The PND 1 and the SBD 2 are mounted on the lead frame 5, and the IGBT 3 is mounted on the lead frame 6.

As illustrated in FIG. 2 and FIG. 3, the anode of the PND 1 and the anode of the SBD 2 are connected to each other by a wiring 8 and the anode of the SBD 2 and the lead frame 6 are connected to each other by the wiring 8. As illustrated in FIG. 2, the lead frame 6 and the lead frame 7 corresponding to the output electrode are connected to each other by the wiring 8. In other words, the anode of the PND 1 is connected to the output electrode by the wiring 8 via the anode of the SBD 2. The inductance L1 is formed by the wiring 8 connecting the anode of the PND 1 and the anode of the SBD 2, and the inductance L2 is formed by the wiring 8 connecting the anode of the SBD 2 and the lead frame 6. As illustrated in FIG. 2, the lead frame 4 and an emitter electrode of the IGBT 3 are connected to each other by the wiring 8.

That is to say, the semiconductor device 101 in the embodiment 1 includes the IGBT 3 which is the switching clement, the SBD 2 connected to the IGBT 3 in series, the PND 1 connected to the IGBT 3 in series and parallelly connected to the SBD 2, and the output electrode connected between the IGBT 3 and the SBD 2 and between the IGBT 3 and the PND 1. The anode electrode of the PND 1 is connected to the output electrode by the wiring 8 via the anode electrode of the SBD 2. According to such a configuration, the inductance between the anode of the PND 1 and the output electrode can be made larger than the inductance between the anode of the SBD 2 and the output electrode. Accordingly, a fall time of a forward current of the PND 1 is longer than a fall time of a forward current of the SBD 2.

Figure 4:
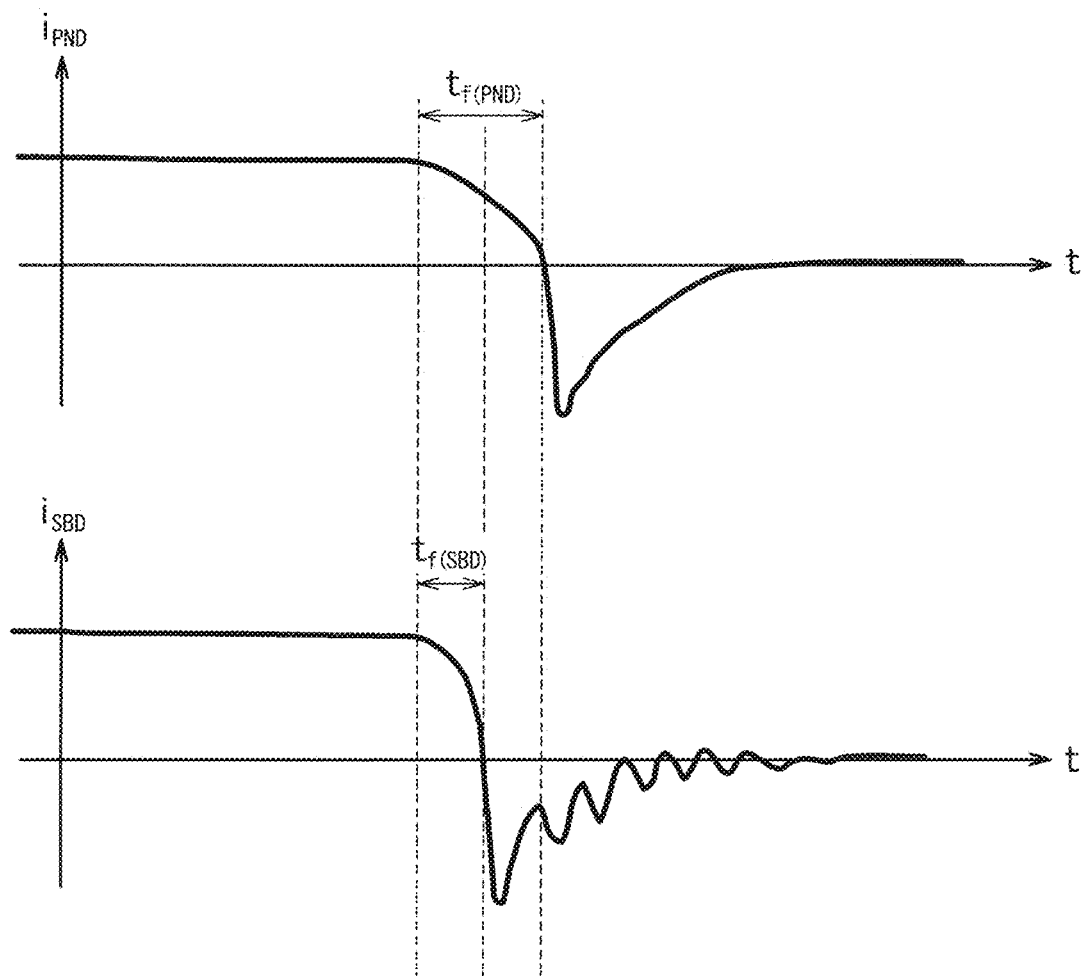
FIG. 4 is a diagram illustrating a current waveform of an SBD and a PND in the semiconductor device according to the embodiment 1.

FIG. 4 indicates a current waveform of the SBD 2 and the PND 1, a lateral axis indicating a time. As illustrated in FIG. 4, the current waveform oscillates after recovery in the SBD 2, A fall time tf of a forward current iPND in the PND 1 (PND) is made longer than a fall time tf of a forward current iSBD in the SBD 2 (SBD) by the inductance, thus the oscillation of the current waveform in the SBD 2 after recovery, that is to say, a ringing is suppressed.

When an effective area of the PND 1 parallelly connected to the SBD 2 is large, a recovery current increases, and an effect of reducing the switching loss in the diode by the SBD 2 cannot be sufficiently obtained. Thus, the effective area of the PND 1 is preferably larger than an effective area of the SBD 2.

B. Embodiment 2

Figure 6:
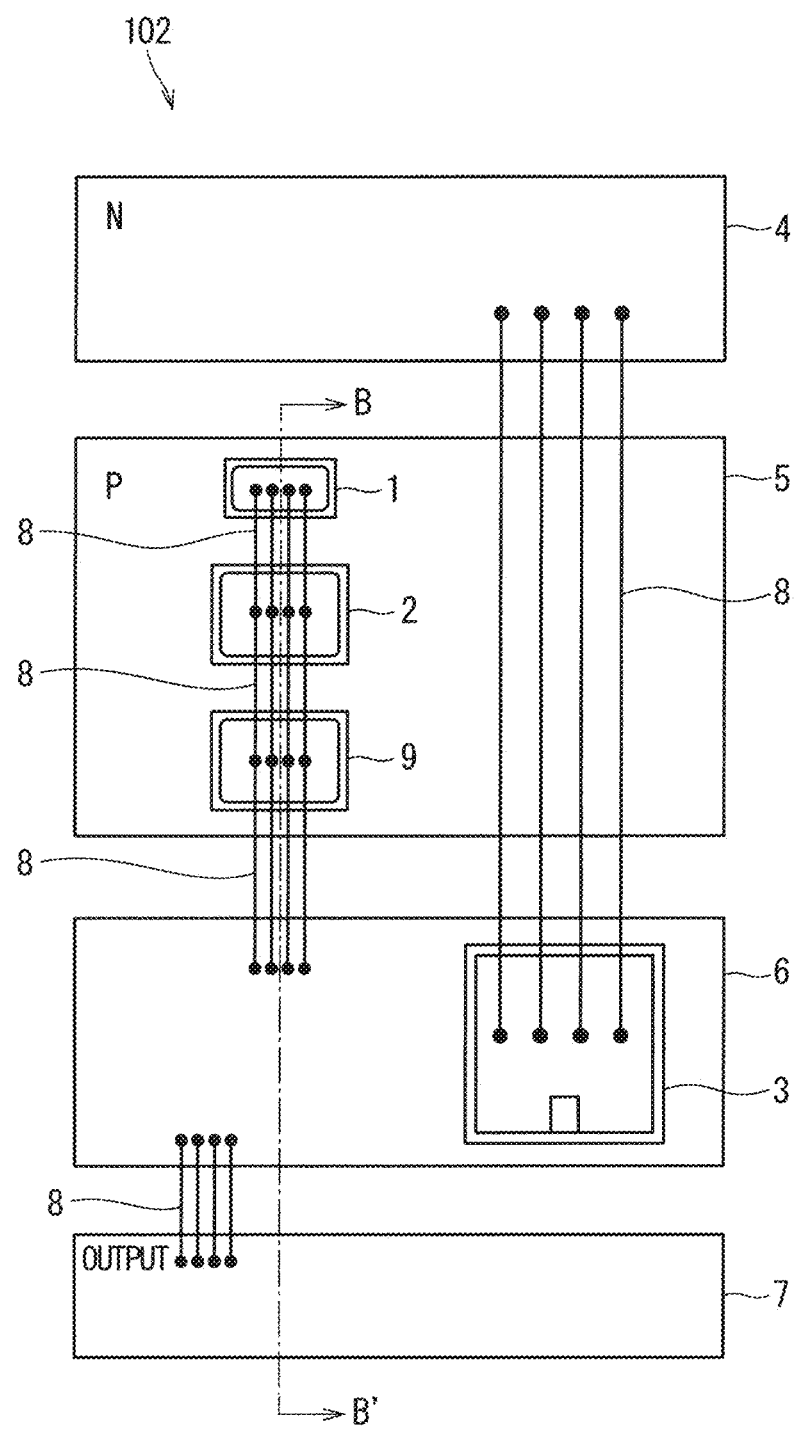
FIG. 6 is a top view of the semiconductor device according to the embodiment 2.
Figure 7:
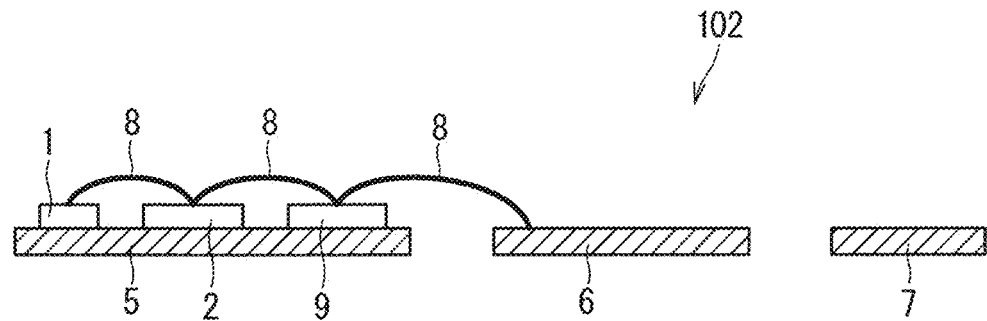
FIG. 7 is a cross-sectional view of the semiconductor device according to the embodiment 2.

FIG. 5 is a circuit diagram of a main portion of a semiconductor device 102 according to an embodiment 2. FIG. 6 is a top view of the main portion of the semiconductor device 102. FIG. 7 is a cross-sectional view along a B-B' line in FIG. 6. The semiconductor device 102 is different from the semiconductor device 101 in that an SBD is made up of a plurality of chips. That is to say, the semiconductor 102 includes and SBD 21 and an SBD 22 in place of the SBD 2 when compared to the configuration of the semiconductor device 101. Each of the SBD 21 and the SBD 22 is connected to the IGBT 3 in series, and is parallelly connected to each other. An output electrode is provided between the IGBT 3 and the PND 1 and between the SBD 21 and the SBD 22.

The inductance L1 is formed between the anode of the PND 1 and an anode of the SBD 21. An inductance L21 is formed between the anode of the SBD 21 and an anode of the SBD 22. An inductance L22 is formed between the SBD 22 and the output electrode. Accordingly, an inductance between the de of the PND 1 and the output electrode is L1+L21+L22, which is larger than the inductance L21+L22 formed between the anode of the SBD 21 and the output electrode and the inductance L22 formed between the anode of the SBD 22 and the output electrode.

As illustrated in FIG. 6, the SBD 21 and the SBD 22 are mounted on the same lead frame 5 as the PND 1. The PND 1, the SBD 21, and the SBD 22 are mounted on the lead frame 5 in this order in one direction.

As illustrated in FIG. 7, the anode of the PND 1 and the anode of the SBD 21 are connected to each other by the wiring 8, and the anode of the SBD 21 and the anode of the SBD 22 are connected to each other by the wiring 8. The anode of the SBD 22 and the lead frame 6 are connected to each other by the wiring 8. The inductance L1 is formed by the wiring 8 connecting the anode of the PND 1 and the anode of the SBD 21, the inductance L21 is formed by the wiring 8 connecting the anode of the SBD 21 and the anode of the SBD 22, and the inductance L22 is formed by the wiring 8 connecting the anode of the SBD 22 and the lead frame 6.

As described above, in the semiconductor device 102 in the embodiment 2, the plurality of SBDs 21 and 22 are connected in series to the IGBT 3 which is the switching element. The plurality of SBDs 21 and 22 are connected in parallel to each other. The anode electrode of the PND 1 and the plurality of anode electrodes of the SBDs 21 and 22 are connected by the wiring 8 in order. As described above, even when the SBD is made up of the plurality of chips, the effect similar to the embodiment 1 can be obtained. Accordingly, when the embodiment 1 and the embodiment 2 are summed up, at least one SBD may be connected in series to the IGBT 3 which is the switching element.

However, when the SBD is made up of the plurality of chips as is the case in the embodiment 2, a sum of the effective area of the SBD 21 and the SBD 22 is preferably the same as the effective area of the SBD 2 in the embodiment 1. That is to say, in the semiconductor device 102 in the embodiment 2, the SBD is made up of the plurality of separated chips while the effective area remains the same, thus a heat radiation property of. the chip increases and the loss in the SBD at a time of high-temperature operation decreases compared with the semiconductor device 101 in the embodiment 1.

C. Embodiment 3

Figure 8:
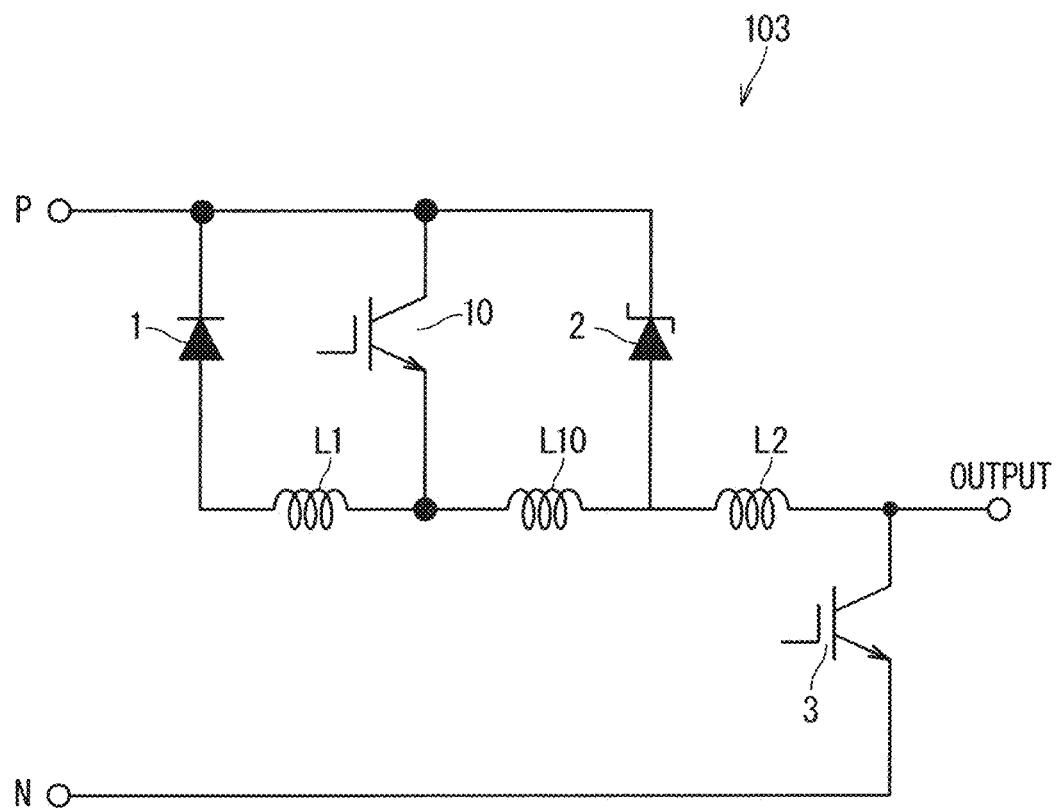
FIG. 8 is a circuit diagram of a semiconductor device according to an embodiment 3.
Figure 9:
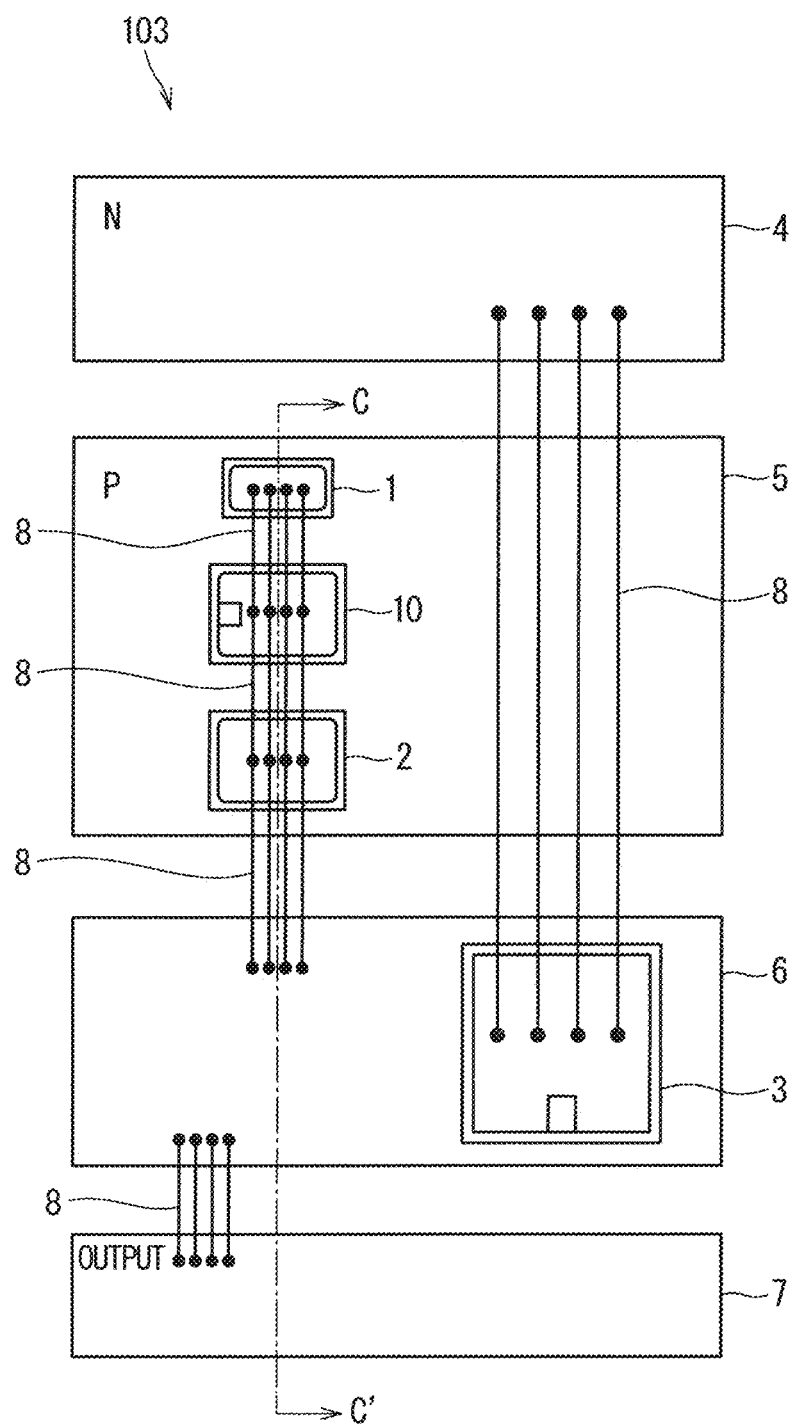
FIG. 9 is a top view of the semiconductor device according to the embodiment 3.
Figure 10:
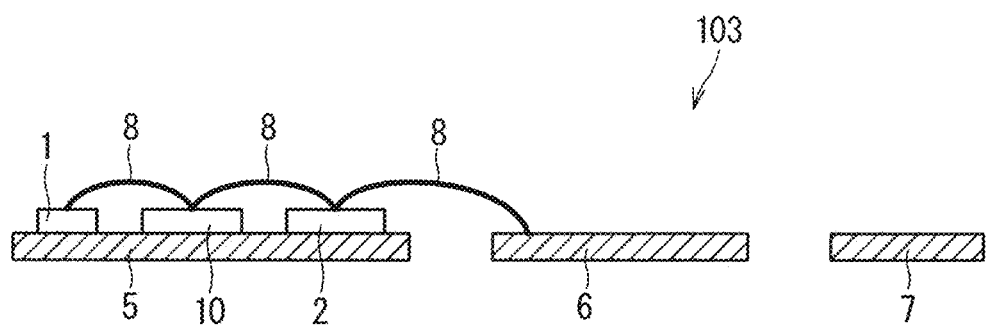
FIG. 10 is a cross-sectional view of the semiconductor device according to the embodiment 3.

FIG. 8 is a circuit diagram of a main portion of a semiconductor device 103 according to an embodiment 3. FIG. 9 is a top view of the main portion of the semiconductor device 103. FIG. 10 is a cross-sectional view along a C-C' line in FIG. 9. The semiconductor device 103 has a configuration similar to that of the semiconductor device 101 to which an IGBT 10 parallelly connected to the PND 1 and the SBD 2 is added. The configuration of the semiconductor device 103 different from that of the semiconductor device 101 is described hereinafter.

The inductance L1 is formed between the anode of the PND 1 and an emitter of the IGBT 10, an inductance L10 is formed between the emitter of the IGBT 10 and the anode of the SBD 2, and the inductance L2 is formed between the anode of the SBD 2 and the output electrode.

As illustrated in FIG. 9, the PND 1, the. IGBT 10, and the SBD 2 are mounted on the lead frame 5 in this order in one direction. As illustrated in FIG. 10, the anode of the PND 1 and the emitter of the IGBT 10 are connected to each other by the wiring 8, thereby forming the inductance L1. The emitter of the IGBT 10 and the anode of the SBD 2 are connected to each other by the wiring 8, thereby forming the inductance L10. A wiring other than the above configuration is similar to that in the embodiment 1.

In other words, the anode of the PND 1 is connected to the output electrode by the wiring 8 via the emitter electrode of the IGBT 10 and the anode electrode of the SBD 2. According to the semiconductor device 103, the IGBT 10 is provided between the PND 1 and the SBD 2, thus the inductance L10 is added to the inductance from the anode of the PND 1 to the output electrode. Accordingly, the inductance from the anode of the PND 1 to the output electrode is sufficiently larger than the inductance L2 from the anode of the SBD 2 to the output electrode. As a result, the fall time of the forward current of the PND 1 is sufficiently longer than the fall time of the forward current of the SBD and the ringing is sufficiently suppressed.

Described above is the semiconductor device 103 in the present embodiment having the configuration similar to that of the semiconductor device 101 in the embodiment 1 to which the IGBT 10 is added. However, the IGBT 10 may be added to the configuration in the semiconductor device 102 of the embodiment 2, and the similar effect can be obtained.

In FIGS. 3, 7, and 10, the wiring 8 connecting the semiconductor chips is applied with a stitch, however, the wiring 8 connecting each semiconductor chip needs not be continuously applied.

The semiconductor device 103 has a configuration similar to that of the semiconductor device 101 to which an IGBT 10 is added. The IGBT 10 can be formed on the lead frame 5 by the same process as the process of forming the IGBT 3 on the lead fame 6. Thus, the semiconductor device 103 can be easily manufactured without adding a new manufacturing process compared with the semiconductor device 101.

D. Embodiment 4

Figure 11:
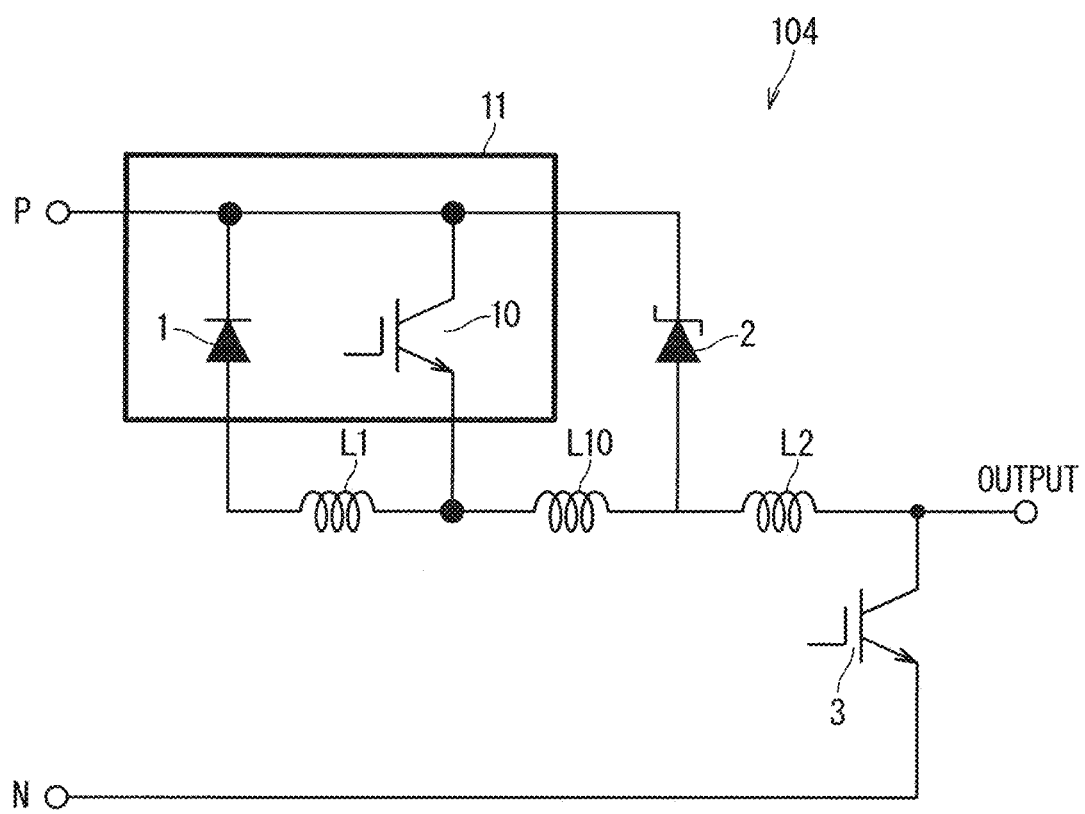
FIG. 11 is a circuit diagram of a semiconductor device according to an embodiment 4.
Figure 12:
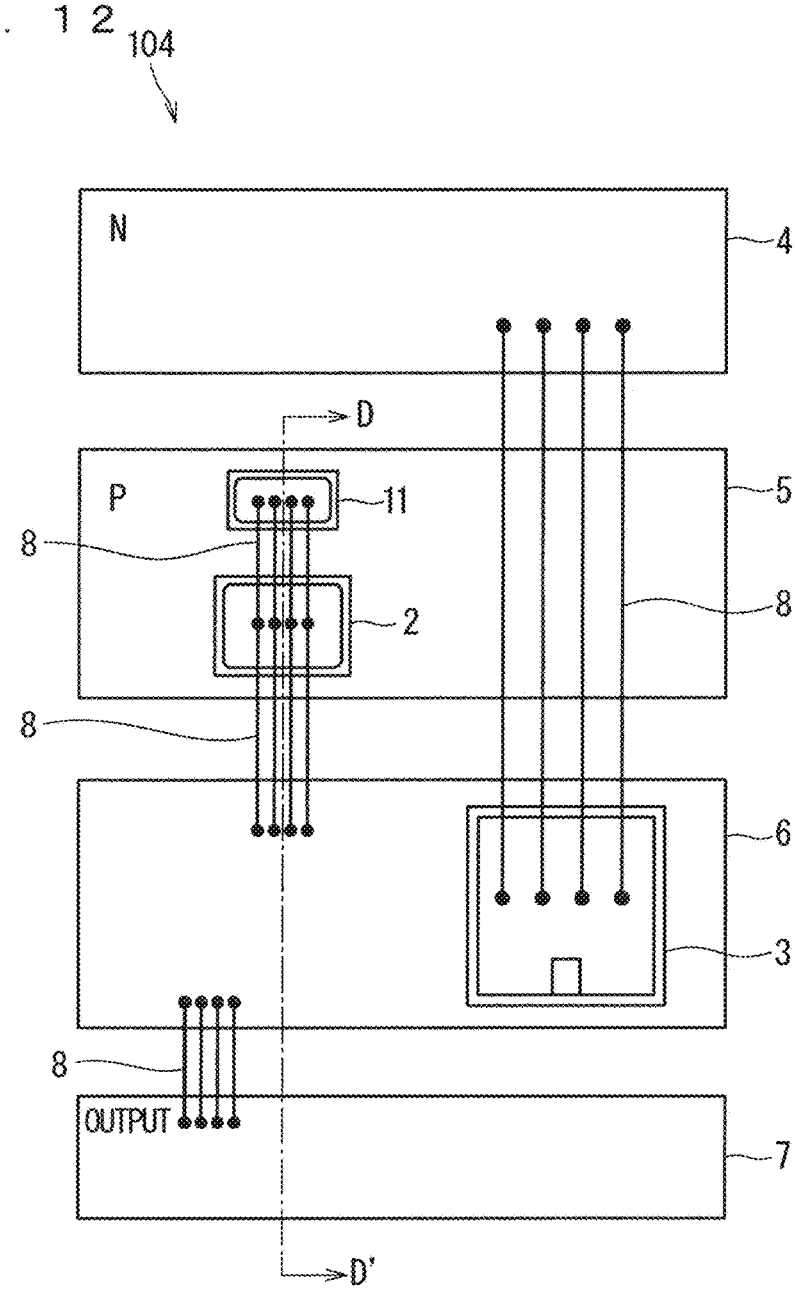
FIG. 12 is a top view of the semiconductor device according to the embodiment 4.
Figure 13:
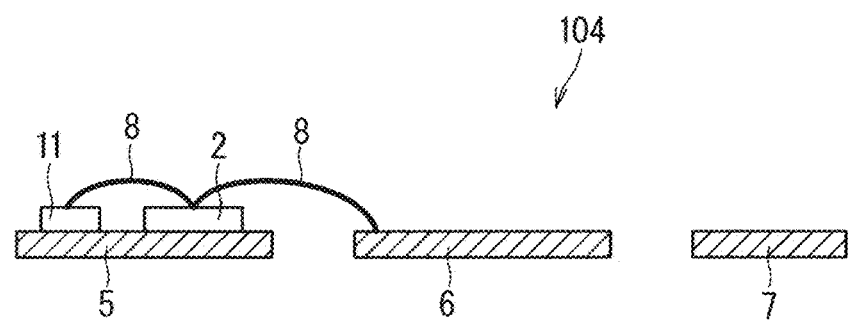
FIG. 13 is a cross-sectional view of the semiconductor device according to the embodiment 4.
Figure 14:
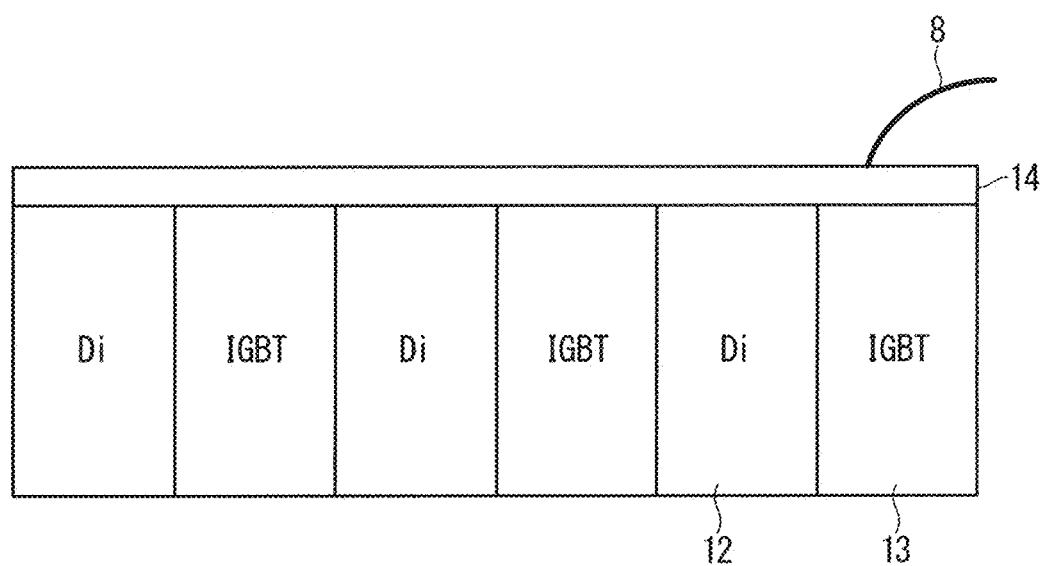
FIG. 14 is an enlarged cross-sectional view of a wire connection part of an RC-IGBT in the semiconductor device according to the embodiment 4.

FIG. 11 is a circuit diagram of a main portion of a semiconductor device 104 according embodiment 4. FIG. 12 is a top view of the main portion of the semiconductor device 104. FIG. 13 is a cross-sectional view along a D-D' line in FIG. 12. FIG. 14 is an enlarged cross-sectional view in which a wire connection part of a reverse-conducting IGBT (RC-IGBT) 11 is enlarged.

The semiconductor device 104 is the same as the semiconductor device 103 in the embodiment 3 in which the PND 1 and the IGBT 10 are made up of the RC-IGBT 11. That is to say, the RC-1GBT 11 and the SBD 2 are mounted on the lead frame 5. As illustrated in FIG. 12 and FIG. 13, the RC-IGBT 11 and the anode of the SBD 2 are connected to each other by the wiring 8, and the anode of the SBD 2 and the lead frame 6 are connected to each other by the wiring 8.

As illustrated in FIG. 14, the RC-IGBT 11 includes a super junction structure of a diode region 12 of a semiconductor layer operating as a diode and an IGBT region 13 of a semiconductor layer operating as an IGBT and a surface electrode 14 on these semiconductor layers. The wiring 8 connecting the RC-IGBT 11 and the anode of the SBD 2 is connected to a region in the surface electrode 14 located immediately above the IGBT region 13 in the RC-IGBT 11. In other words, the wiring 8 connecting the RC-IGBT 11 and the anode of the SBD 2 is connected in the IGBT region 13 via the surface electrode 14 in the RC-IGBT 11.

The inductance L10 is formed by the wiring 8 connecting the RC-IGBT 11 and the anode of the SBD 2. The inductance L1 is formed by the surface electrode 14 extending over the diode region 12 and the IGBT region 13.

According to the configuration of the semiconductor device 104 described above, the semiconductor device 104 can be downsized compared with the semiconductor device 103 in the embodiment 3 in which the PND 1 and the IGBT 10 are separately provided.

According to the present invention, each embodiment can be arbitrarily combined, or each embodiment can be appropriately varied or omitted within the scope of the invention.

What is claimed is:

1. A semiconductor device, comprising:
   a switching element;
   at least one SBD connected to the switching element in series;
   a PND connected to the switching element in series and parallelly connected to the at least one SBD; and
   an output electrode connected between the switching element and the at least one SBD and between the switching element and the PND, wherein
   an anode electrode of the PND is connected to the output electrode by a wiring via an anode electrode of the at least one SBD.

2. The semiconductor device according to claim 1, wherein
   an effective area of the PND is smaller than an effective area of the at east one SBD.

3. The semiconductor device according to claim 1, wherein
   the at least one SBD includes a plurality of SBDs connected in parallel to each other.

4. The semiconductor device according to claim 1, further comprising
   an IGBT parallelly connected to the PND, wherein
   an anode electrode of the PND is connected to the output electrode by the wiring via an emitter electrode of the IGBT and the anode electrode of the at least one SBD.

5. The semiconductor device according to claim 4, wherein
   the PND and the IGBT are made up of an RC-IGBT, and
   a region in a surface electrode of the RC-IGBT located immediately above the IGBT region and the anode electrode of the at least one SBD are connected to each other by the wiring.

* * * * *